(12) United States Patent
Tokiwa

(10) Patent No.: US 8,117,508 B2
(45) Date of Patent: Feb. 14, 2012

(54) NON-VOLATILE MEMORY DEVICE AND PROGRAMMING METHOD THEREOF

(75) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 12/650,006

(22) Filed: Dec. 30, 2009

(65) Prior Publication Data

US 2011/0066900 A1 Mar. 17, 2011

(30) Foreign Application Priority Data

Sep. 11, 2009 (JP) ................. 2009-210418

(51) Int. Cl.
*G06F 11/00* (2006.01)
(52) U.S. Cl. .............. 714/704; 365/148; 365/189.16
(58) Field of Classification Search .......... None
See application file for complete search history.

(56) References Cited

U.S. PATENT DOCUMENTS

| | | | | |
|---|---|---|---|---|
| 6,075,719 A * | 6/2000 | Lowrey et al. | ............... | 365/148 |
| 6,751,114 B2 * | 6/2004 | Gilton et al. | ............... | 365/100 |
| 6,922,364 B2 * | 7/2005 | Kojima | ............... | 365/185.33 |
| 7,167,390 B2 * | 1/2007 | Ishida et al. | ............... | 365/163 |
| 7,400,528 B2 * | 7/2008 | Happ et al. | ............... | 365/185.03 |
| 7,522,449 B2 * | 4/2009 | Ro et al. | ............... | 365/163 |
| 7,529,124 B2 * | 5/2009 | Cho et al. | ............... | 365/163 |
| 7,590,006 B2 | 9/2009 | Tokiwa | | |
| 7,751,232 B2 * | 7/2010 | Lee et al. | ............... | 365/163 |
| 7,843,741 B2 * | 11/2010 | Jeong et al. | ............... | 365/189.04 |
| 7,940,553 B2 * | 5/2011 | Wu et al. | ............... | 365/163 |
| 2008/0002456 A1 * | 1/2008 | Toda et al. | ............... | 365/148 |
| 2008/0209112 A1 * | 8/2008 | Yu et al. | ............... | 711/103 |
| 2008/0258129 A1 | 10/2008 | Toda | | |

FOREIGN PATENT DOCUMENTS

| | | |
|---|---|---|
| JP | 2005-522045 | 7/2005 |
| JP | 2008-4178 | 1/2008 |
| JP | 2009-99199 | 5/2009 |
| WO | WO 2009/051274 A1 | 4/2009 |

OTHER PUBLICATIONS

U.S. Appl. No. 12/680,582, filed Mar. 29, 2010, Nagashima, et al.

* cited by examiner

*Primary Examiner* — Jeffrey A Gaffin
*Assistant Examiner* — Steve Nguyen
(74) *Attorney, Agent, or Firm* — Oblon, Spivak, McClelland, Maier & Neustadt, L.L.P.

(57) ABSTRACT

A non-volatile memory device including: a memory cell array storing an electrically rewritable resistance value as data in a non-volatile manner; a first cache circuit configured to hold program data to be programmed in the cell array; a second cache circuit configured to hold preprogrammed data read from an area of the cell array; and a judging circuit configured to compare and check the program data with the preprogrammed data, and judge whether there are one or more disagreement bits therebetween or not.

18 Claims, 17 Drawing Sheets

(a) Schottky Diode (d) MIM Diode (b) PN Diode (e) SIS Diode (c) PIN Diode

| CACHE1 | Verify-Read Result | N0 | N1 | N2 |
|---|---|---|---|---|
| 0 | 1 | 1 | 1 | 0 |
| 1 | 0 | 1 | 0 | 1 |
| 1 | 1 | 0 | 0 | 0 |
| 0 | 0 | 0 | 0 | 0 |

FIG. 17

| Bit No. | 7 | 6 | 5 | 4 | 3 | 2 | 1 | 0 | Number of Disagreement Bits |
|---|---|---|---|---|---|---|---|---|---|
| CACHE1 | 1 | 0 | 1 | 0 | 1 | 0 | 1 | 0 | ----- |
| Verify-Read Result | 1 | 1 | 1 | 1 | 1 | 1 | 0 | 1 | ----- |
| N1 | 0 | 1 | 0 | 1 | 0 | 1 | 0 | 1 | 4bit |
| N2 | 0 | 0 | 0 | 0 | 0 | 0 | 1 | 0 | 1bit |
| N0 | 0 | 1 | 0 | 1 | 0 | 1 | 1 | 1 | 5bit |

FIG. 18

Status Read Result

| 1→0 Program Fail | 0→1 Program Fail | Program Fail | Reserved |
|---|---|---|---|
| Intrinsic 1→0 Program Fail | Intrinsic 0→1 Program Fail | Intrinsic Program Fail | Reserved |

NON-VOLATILE MEMORY DEVICE AND PROGRAMMING METHOD THEREOF

CROSS-REFERENCE TO RELATED APPLICATION

This application is based on and claims the benefit of priority from the prior Japanese Patent Application No. 2009-210418, filed on Sep. 11, 2009, the entire contents of which are incorporated herein by reference.

BACKGROUND OF THE INVENTION

1. Field of the Invention

This invention relates to a non-volatile memory device, in which a resistance-change element is used as an electrically rewritable memory cell to store a resistance value as data.

2. Description of the Related Art

To achieve a large capacity of a non-volatile memory device, it is noted such a method as to three-dimensionally stack memory cells for storing resistance values thereof as data. There have been proposed, for example, a phase change memory (PC RAM) and a resistance change memory (ReRAM) as typical examples. Used as a resistance change element (i.e., variable resistance element) in the former is a calcogenide element; and used as the resistance change element in the latter is a transition metal oxide layer.

To fabricate a highly integrated memory device with a low cost, it is desired to dispose memory cells only at the cross points of column select lines and row select lines arranged to cress each other. Further, to achieve high integration and capacity-increase of the memory, it is desired to three-dimensionally stack the memory cells. There have already been proposed three dimensional cell arrays, for example, in JP2005-522045A and JP2006-514393A.

To make the memory cell's operation control easy, it is required of the variable resistance element to be coupled to a diode in series without transistors. In this case, it is utilized such a unipolar operation that unipolar pulses with different time-widths and different voltages (currents) are used in the set and reset operations.

On the other hand, in a bipolar type of ReRAM, voltages (currents) with different directions are used in the set and reset operations (for example, see JP2009-217908A).

In general, in a non-volatile semiconductor memory device, data write (or program) is performed page by page, and checking (or verify-reading, or verifying simply) operation is performed for checking the program data with the practically programmed data within the program sequence. Further, in accordance with that the non-volatile memory device is highly integrated and a memory controller for the memory device is made to be highly functional, it is used such a technology that if a fail bit number is equal to or smaller than an error-correctable bit number in a page, the fail bit number is permitted, while maintaining the program performance.

That is, it is known that that a fail bit count circuit is installed in a non-volatile memory device, and a comparing circuit is disposed therein for comparing the fail bit number with a predetermined permissible fail bit number. For example, refer to JP2008-4178A.

However, in the ReRAM formed of resistance change elements, as different from the conventional non-volatile memory device, in which the cell threshold defined by the charge amount stored in the floating gate is used as data, for example, a NAND-type flash memory, it is possible to set a program unit and an erase unit to be identical with each other. Additionally, as different from the NAND-type flash memory, it is unnecessary for the ReRAM to erase a block including a noticing page prior to the data program, and direct rewrite may also be performed.

Due to the difference of the program methods, in the non-volatile memory device with resistance change elements arranged therein, it is impossible to use the fail bit count scheme used in the NAND-type flash memory as it is.

SUMMARY OF THE INVENTION

According to an aspect of the present invention, there is provided a non-volatile memory device including:

a memory cell array with memory cells arranged therein, each memory cell storing an electrically rewritable resistance value as data in a non-volatile manner;

a first cache circuit configured to hold program data to be programmed in the memory cell array;

a second cache circuit configured to hold preprogrammed data read from an area of the memory cell array, where the program data is to be programmed; and a judging circuit configured to compare and check the program data loaded in the first cache circuit with the preprogrammed data read in the second cache circuit, and judge whether there are one or more disagreement bits therebetween or not.

According to another aspect of the present invention, there is provided a non-volatile memory device including:

a memory cell array with memory cells arranged therein, each memory cell storing an electrically rewritable resistance value as data in a non-volatile manner;

a page register configured to hold program data to be programmed in the memory cell array and preprogrammed data read from an area of the memory cell array, where the program data is to be programmed;

a judging circuit configured to compare and check the program data with the preprogrammed data, and judge whether there are one or more disagreement bits therebetween or not;

a fail bit counting circuit configured to count the disagreement bits, and compare the disagreement bit number with a permissible value to output a compared result; and a sequence controller configured to control a program sequence in accordance with the compared result.

According to still another aspect of the present invention, there is provided a method of programming a non-volatile memory device with a memory cell array, in which a resistance-change type of memory cells are arranged, including:

loading program data of one page to be simultaneously programmed in the memory cell array;

reading preprogrammed data corresponding to the program data from the memory cell array;

counting disagreement bits between the corresponding bits in the program data and the preprogrammed data;

judging whether the number of the disagreement bits is over a permissible value or not; and controlling data program into the memory cell array in accordance with the judged result.

BRIEF DESCRIPTION OF THE DRAWINGS

FIG. 17 a diagram for explaining the counted result of the fail bit number.

FIG. 18 shows the status read result.

DETAILED DESCRIPTION OF THE EMBODIMENTS

Illustrative embodiments of this invention will be explained with reference to the accompanying drawings below.

Figure 1:
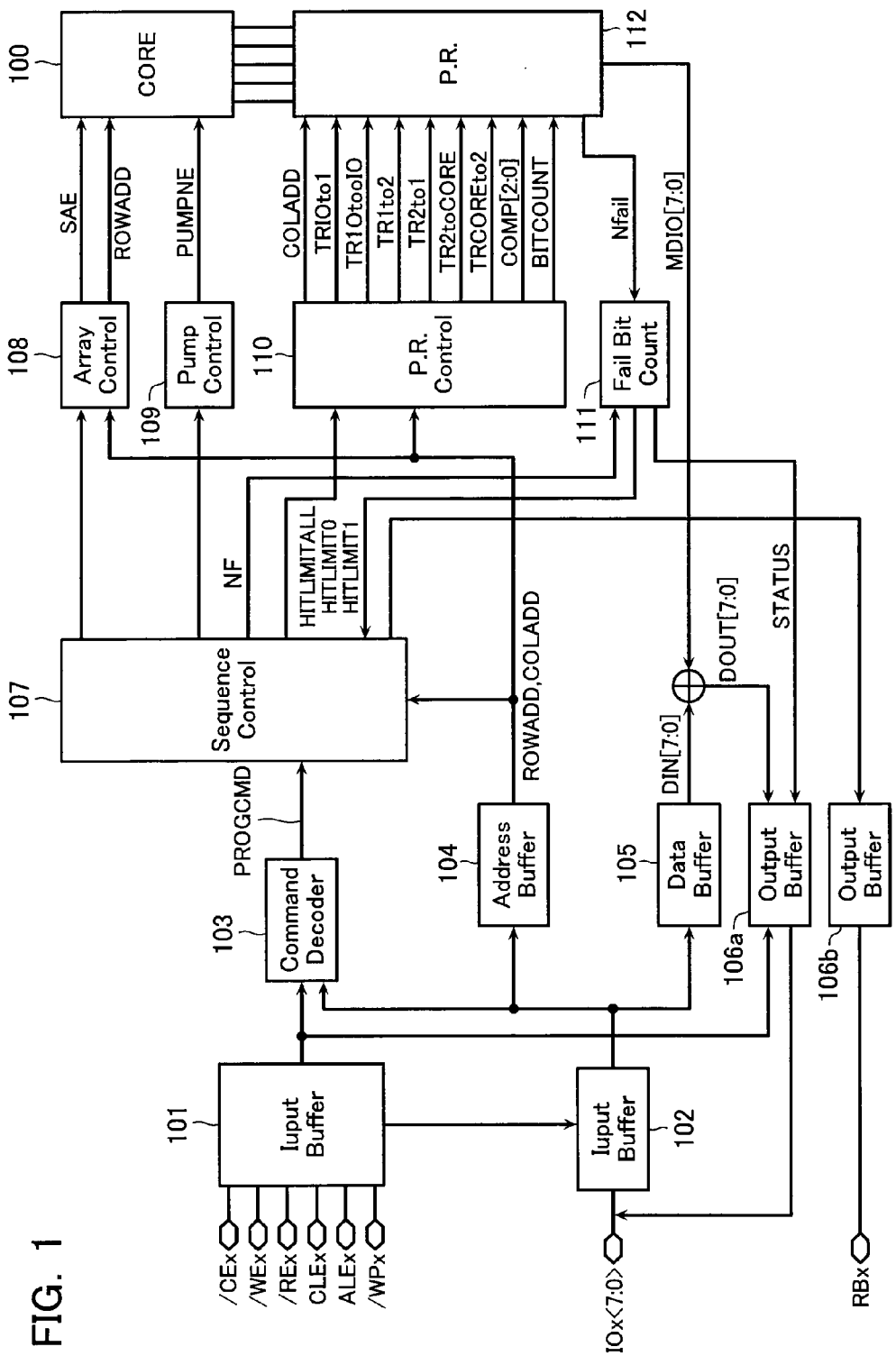
FIG. 1 shows the internal block configuration of the non-volatile memory device in accordance with an embodiment of the present invention.

FIG. 1 shows a functional block of a non-volatile memory device, i.e., ReRAM, with variable resistance elements (resistance change elements) arranged therein in accordance with an embodiment. Control data supplied to the external control pin (i.e., chip enable/CEx, write enable/WEx, read enable/REx, command latch enable CLEx, address latch enable ALEx, write protect/WPx) are input to input buffer 101 for noticing the input/output state at IO pins, distinguishing between command, address and data, and noticing the write protect state and the like.

The IO pins, IOx<7:0>, are formed of bidirectional buses, input signal is input to input buffer 102 while output signal is output from output buffer 106a. This input/output control is performed by the signal generated from the input buffer 101.

Input data will be dispersedly transferred to the internal circuits in accordance with the state of the control pin as follows: command is transferred to command decoder 103; address to address buffer 104; and data to data buffer 105. Address buffer 104 stores temporally column address COLADD and row address ROWADD necessary for programming, erasing and reading, and transfers them to the circuits to be supplied with necessary address data. Here is shown that necessary addresses are transferred to sequence control circuit 107, array control circuit 108 and page register 110.

Command data is decoded in command decoder 103 to start-up the sequence control circuit 107 if necessary. Data buffer 105 stores temporally the input program data, and then transfer it to page register 112. When outputting data, data buffer 105 stops to transmit data of itself so as to avoid data collision on the internal bidirectional data bus MDIO[7:0].

Output buffer 106a has such a function as to output memory cell read data, the internal states of the memory cell array, program result information and the like. Excepting the read operation time, it serves for stopping the IO pins driving.

Output buffer 106b is an output control circuit for noticing externally that this memory device is in a busy state. That is, this output buffer 106b activates signal RBx while the device is in a ready state for receiving the following command, and inactivates signal RBx if the device is in a busy state while it is not permitted to receive the following command.

Sequence control circuit 107 controls all operations of this memory device such as read, program and erase operations, which includes instruction signal outputting for applying necessary bias to the memory cell array, and changing operation for changing data in the address buffer.

In accordance with the instructions of the sequence control circuit 107, array control circuit 108, charge pump control circuit 109 and page register control circuit 110 will be started-up. Array control circuit 108 applies necessary biases to the cell array in the memory core 100, starts up and controls the sense amplifiers and register circuits disposed underlying the cell array. The output signal of the array control circuit 108 includes sense amp activation signal SAE, row address signal ROWADD to be supplied to the row decoder, and the like.

Page register control circuit 110 is for controlling the operation of page register 112. In the page register 112, there are installed two groups of registers, each of which stores one page data serving as a unit for programming data in a lump. The detailed page register configuration necessary in this embodiment will be explained later.

Fail bit counter circuit 111 counts and holds fail bit number and compares it with a predetermined permissible fail bit number output from the sequence control circuit 107 when it is necessary. Although the details will be explained later, in this description, the fail bit number is referred to as a "disagreement bit number", which is searched as a result of checking one page program data with the corresponding pre-programmed data; and the permissible fail bit number is referred to as a predetermined "permissible disagreement bit number" hereinafter. Further, in the following description, the permissible disagreement bit number will be simply referred to as "permissible value".

The compared result will be noticed to sequence control circuit 107 in accordance with the use, or transferred externally via output buffer 106a.

Figure 2:
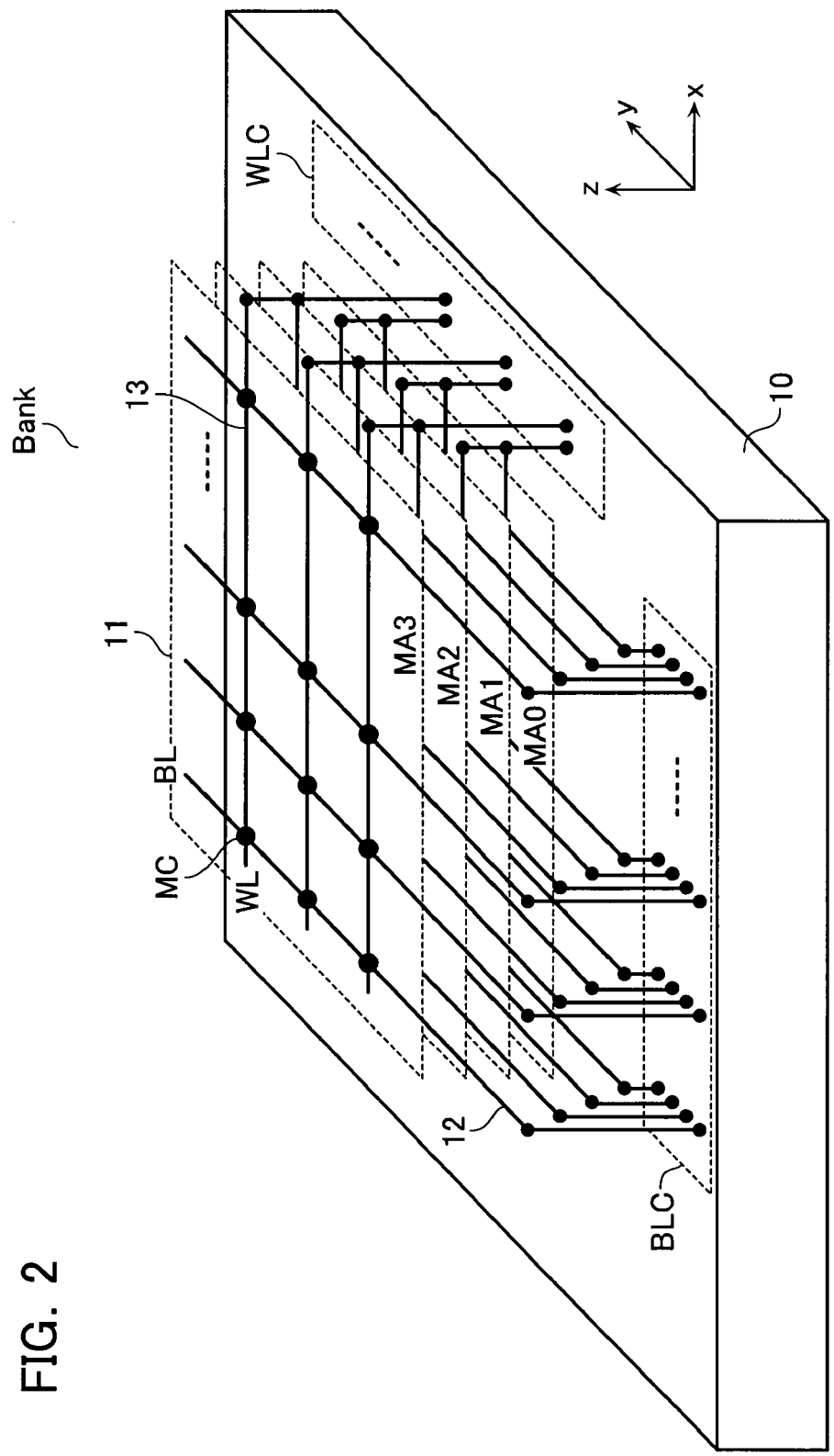
FIG. 2 shows the three dimensional cell array example in the memory core shown in FIG. 1.

FIG. 2 shows the memory cell array 11 in the memory core 100. Memory cell array 11 is formed above a semiconductor substrate, on which periphery circuits such as sense amplifiers, data latches, decoders and the like are formed.

Here is shown such an example that memory cell array 11 includes four cell array layers MA0-MA3 stacked. In each cell array, memory cells MC are disposed at the cross points of row select lines (word lines) WL and column select lines (bit lines) BL.

Disposed at the both ends of word lines WL and bit lines BL are word line hook-up area 12 and bit line hook-up area 13, which are used for hooking-up word lines and bit lines, respectively, to the substrate 10. In these wiring hook-up areas, word lines WL and bit lines BL are coupled to the respective contact nodes in word line contact area WLC and bit line contact area BLC with, for example, via contacts buried therein.

Usually, the array unit shown in FIG. 2 is dealt with a bank, and memory cell array 11 is formed of multiple banks arranged. Therefore, there are often disposed many kinds of logic circuits including word line and bit line decoders in the bank on the substrate 10.

Figure 3:
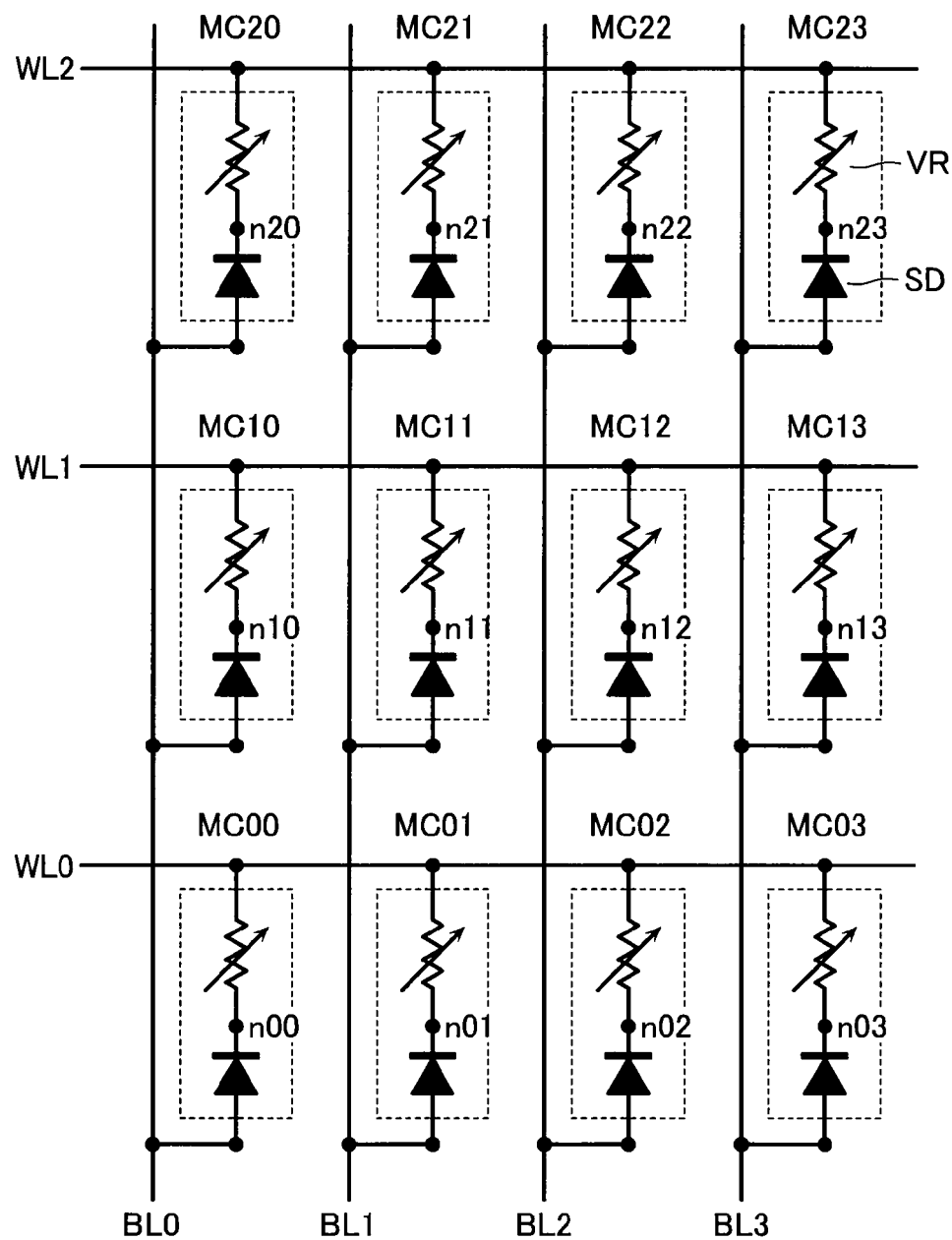
FIG. 3 shows the memory cell array with resistance change elements and diodes.

FIG. 3 shows an equivalent circuit of one cell array layer. Memory cells MCij are disposed at the respective cross points between word lines WLi (i=0, 1, 2, . . . ) and bit lines BLj (j=0, 1, 2, . . . ). Memory cell MCij is a unipolar type, so that it is formed of resistance change element VR and diode SD. In this example, the anode of diode SD is coupled to bit line BLj. Coupled to word line WLi is one node of resistance change element VR, another node of which is coupled to the cathode of diode SD.

The above-described memory cell arrangement is not limited to that shown in FIG. 3. For example, the coupling relationship of the bit lines and word lines may be reversed to that shown in FIG. 3. The coupling relationship between the diode and resistance change element may also be reversed in such a manner that the resistance change element is disposed between the bit line and the anode of the diode. It should be noted that a switching transistor may be used in place of the diode.

Figure 4:
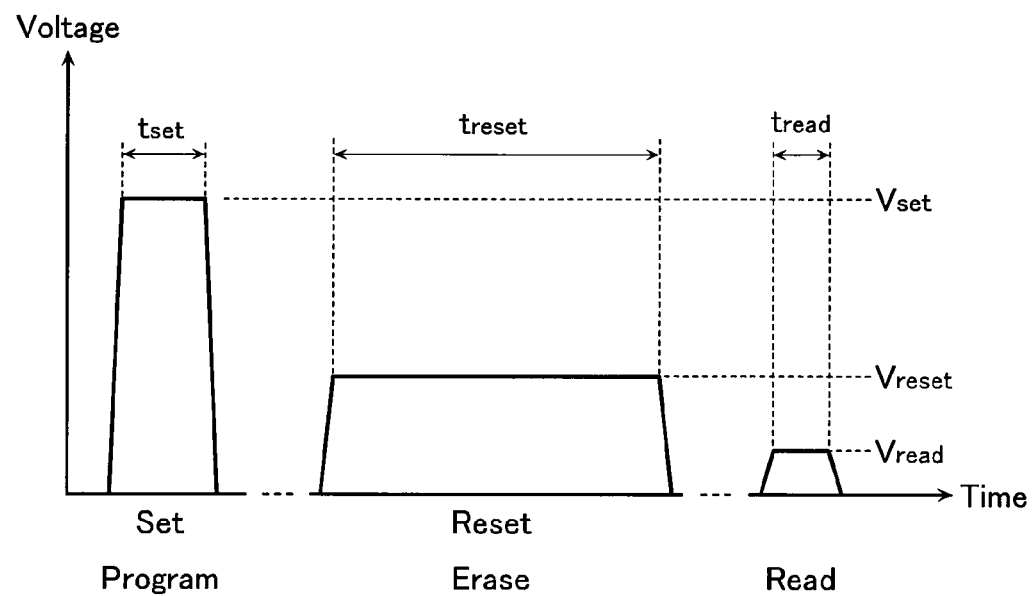
FIG. 4 shows the relationships between voltages and time-lengths in voltage waveforms used for setting (programming), resetting (erasing) and reading a memory cell.

FIG. 4 shows schematic operation pulse waveforms used in setting (programming), resetting (erasing) and reading operations.

In a unipolar type of memory cell array, in which unipolar pulses with different pulse widths and different voltages are used for changing the cell resistance from a set state to a reset state and from a reset state to a set state, select suitable pulse widths and voltages, and it becomes possible to perform set and reset operations simultaneously within one command sequence. This operation will be referred to as "direct program".

That is, it is required of the conventional NAND-type flash memory to use two sequence controls for programming a page in such a manner as to: issue an erase command and erase the cell data in the page (or a block including the page); and after having erased completely, issue a program command together with program data and program cell data in the page.

By contrast, in this embodiment, in one program sequence, in which a program command and program data are applied, necessary cell erase operation is performed. That is, direct program has been achieved.

Note here in FIG. 4 that there is a relationship of $t_{set} < t_{reset}$ between set time $t_{set}$ and reset time $t_{reset}$, and another relationship of $V_{set} > V_{reset}$ between the set voltage $V_{set}$ and reset voltage $V_{reset}$. Further, read voltage $V_{read}$ is sufficiently lower than set voltage $V_{set}$ and reset voltage $V_{reset}$, i.e., there is a relationship of $V_{read} \ll V_{reset}$ and $V_{read} \ll V_{set}$.

It should be noted that, for convenience sake, "0" program operation and "1" program operation are used in place of set operation and reset operation. Here, it doesn't matter which of "0" and "1" data corresponds to set or reset state.

That is, supposing that one of two data states of the memory cell is referred to as "0" data while the other is referred to as "1" data, "0" data program (i.e., transition operation from "1" data state to "0" data state) is referred to as "0" program (or program "0") simply; and "1" data program (i.e., transition operation from "0" data state to "1" data state) is referred to as "1" program (or program "1") simply.

Figure 5:
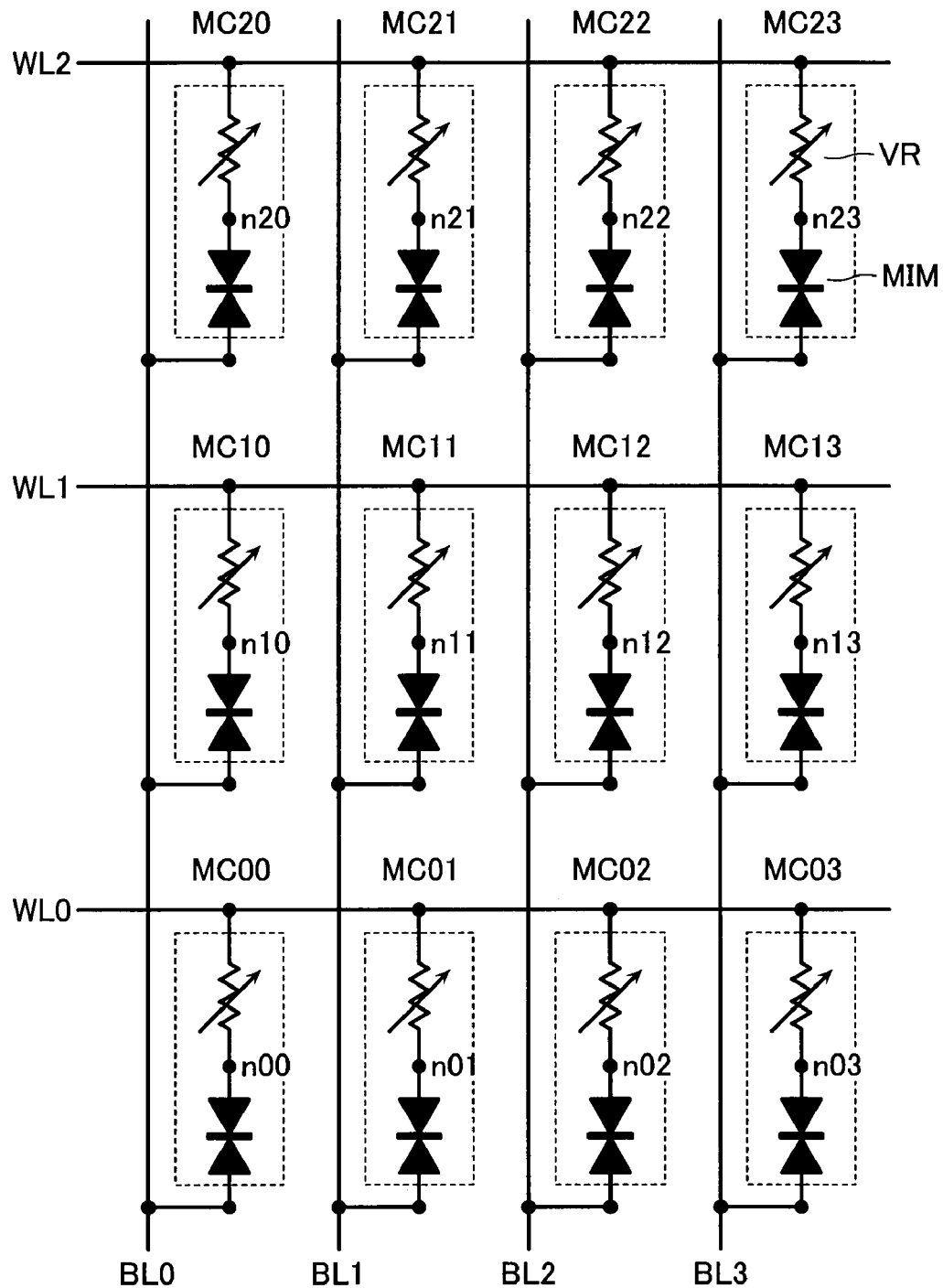
FIG. 5 shows the memory cell array of a bipolar type.

FIG. 5 shows another cell array equivalent circuit in a case where bipolar type memory cells are used. That is, MIM diode "MIM" is used as a non-ohmic device in place of the normal diode SD in FIG. 3.

Figure 6:
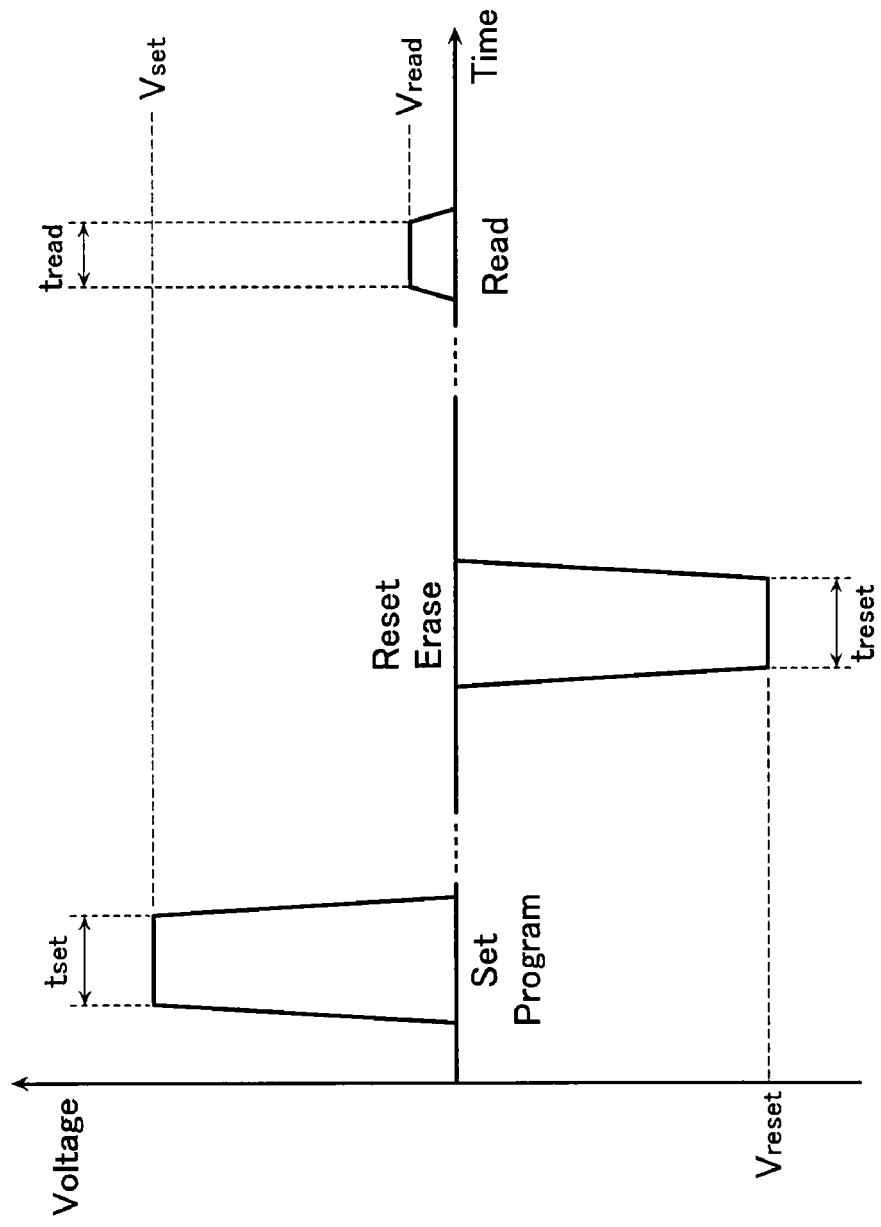
FIG. 6 shows voltage waveforms used in the memory cell array shown in FIG. 5.

FIG. 6 shows schematic operation pulse waveforms used in setting (programming), resetting (erasing) and reading operations in this case. As shown in FIG. 6, the set pulse and the reset pulse have different directions from each other. Although here is shown that the direction of the read pulse voltage is the same as that of the set pulse, it may be set to be the same as the reset pulse.

The relationship between set, reset and read pulse widths $t_{set}$, $t_{reset}$ and $t_{read}$ will be optionally set. Voltage levels Vset and Vreset of the set and reset pulses, respectively, will also be optionally set. With respect to the read pulse voltage Vread, it should be set as follows: |Vset|>Vread or |Vreset|>Vread. This is because that the cell's state change is to be avoided in a read mode.

Figure 7:
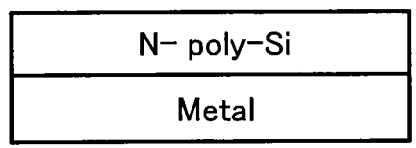
FIG. 7 shows non-ohmic devices.
Figure 7:
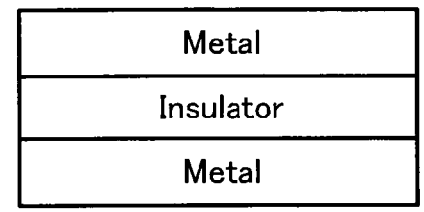
Figure 7:
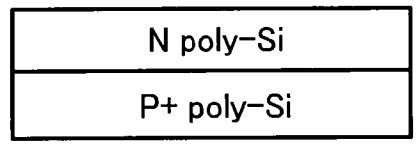
Figure 7:
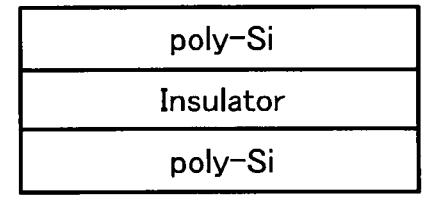
Figure 7:
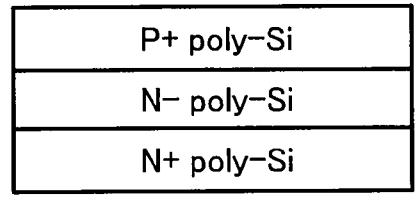

FIG. 7 shows some non-ohmic devices adaptable to the ReRAM cell. (a) Schottky diode, (b) PN diode and (c) PIN diode are adapted to the unipolar type of ReRAMs while (d) MIM (Metal-Insulator-Metal) diode and (e) SIS (Silicon-Insulator-Silicon) diode will are adapted to the bipolar type of ReRAMs.

A program operation will be explained in detail below. Although, in the successive explanations, it is assumed that the unipolar type memory cells are used, it should be noted that the program operation may be effective for the bipolar type memory cells.

Figure 8:
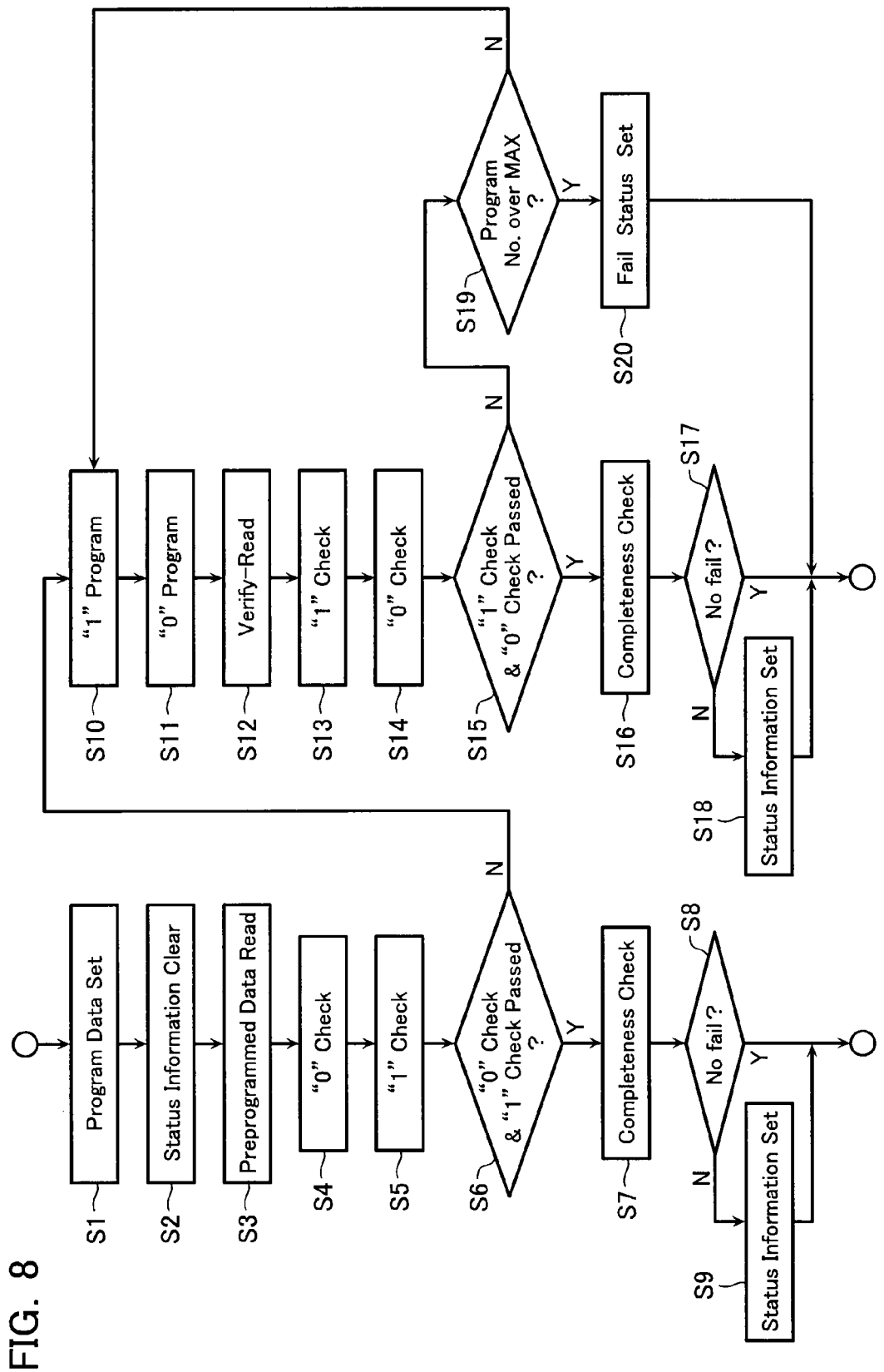
FIG. 8 shows the internal operation of the flow chart in a direct program sequence.

FIG. 8 shows the program operation flow of the ReRAM in accordance with this embodiment.

At step S1, following program command and address, program data is loaded into the ReRAM. The program data is supplied by maximum one page (for example, 2 kByte). After applying the program data, program start (i.e., execute) command is issued.

At step S2, some registers (not shown), which are used for programming the corresponding page, are initialized. For example, status information such as the programmed result information, the counted result information of the fail bit counting circuit and the like will be erased in this initializing step.

In the direct program operation, in consideration of the preprogrammed data, the following program control will be performed: necessary cells are applied with set pulse; other necessary cells are applied with reset pulse; and the remaining cells, in which there is no need of rewriting data, are not applied with any program pulse. For this purpose, at step S3, preprogrammed data is read from the cell array, in which program data is to be programmed.

Explaining in detail, the read pulse shown in FIG. 4 is applied to the selected page of the memory cell array; the sense amplifier circuit is activated; and the read data is transferred to and stored in page register circuit 112.

Performed at step S4 is a first check operation (i.e., "0" check operation) for checking the program data with the read data (i.e., preprogrammed data), and following it a second check operation (i.e., "1" check operation) similar to the first check operation is performed at step S5. Explaining in detail, "0" check is for comparing and checking "0" program data with the corresponding preprogrammed data; and "1" check operation is for comparing and checking "1" program data with the corresponding preprogrammed data.

In case it is judged as a result of the checking operations at steps S4 and S5 that the corresponding page is not necessary to be rewritten (i.e., data to be over-programmed are identical with the preprogrammed data, or the difference bit number is smaller than a permissible disagreement bit number (i.e., permissible value), the judging step S6 is passed, and go to step S7 for performing a "completeness checking operation".

The completeness checking operation (step S7) is for judging that the program data and the preprogrammed data are completely identical with each other, i.e., there is not a disagreement bit therebetween. In a memory control circuit coupled to the ReRAM, an error correction circuit is usually installed. If there is no error in the read data, it may be reduced a wasteful processing time and the operation current used in the error correction circuit. Therefore, it is necessary for the ReRAM to judge whether the completeness checking operation is passed or not.

After the completeness check, it is judged whether there is no fails or not at step S8. If YES, the sequence ends. In case the complete agreement is not confirmed, the status information is set to be "incomplete agreement", and the sequence ends.

If it is judged at step S6 that it is in need of rewriting data, go to "1" program operation (step S10), and successively go to "0" program operation (step S11). The programming order is not matter, and it is possible to perform these "1" and "0" program operations simultaneously in parallel.

After programming, program verify-read is performed (step S12). Following it, "1" check operation with respect to "1" programming (step S13) and "0" check operation with respect to "0" programming (step S14) are performed.

Note here, it may be used such a procedure that "1" check operation is performed just after "1" program; and "0" check operation is performed just after "0" program.

These data checking operations after programming and the following condition judging step (S15) are the same as those performed prior to the programming. The detailed circuits will be explained later.

If "YES" at the condition judging step S15 for judging whether the "1" check and "0" check are passed or not, as similar to the operations prior to programming, completeness checking operation (step S16), fail judging operation (step S17) and status information setting operation (step S18) are sequentially performed.

If it is judged "NO" at the condition judging step S15, go to the following judge step S19 for judging whether the program number is over the maximum value or not. Although there is not shown in the drawings, reprogram operations may be limited in accordance with the conventional technology, i.e., in accordance with the maximum program time and maximum program pulse application number.

If it is judged to be over the maximum program number, it designates that the program data has a disagreement bit number larger than the permissible value. Therefore, it is performed to write the fail information into the status register such that the corresponding page program has not been performed normally (step S20), and then finish the operation flow.

In the above-described operation flow, although few operations are explained conveniently as different operations, these may be performed simultaneously in parallel. For example, "0" and "1" program operations may be started simultaneously in parallel. A part of or the entire "0" and "1" check operations may also be simultaneously started in parallel. Further, the order of these operations may be reversed unless it is out of the essential matter of this embodiment.

In the ReRAM, it is usual to supply current voltages for data rewriting, and there is a restriction of rewritable bit number due to heat generated by the current. In this case, in place of that the check operation is performed after having rewritten all bits, it becomes possible to divide a sequential checking operation into multiple units, and repeatedly perform the same operations for every unit. In this case, the operation flows may be changed partially or performed simultaneously in parallel.

Figure 9:
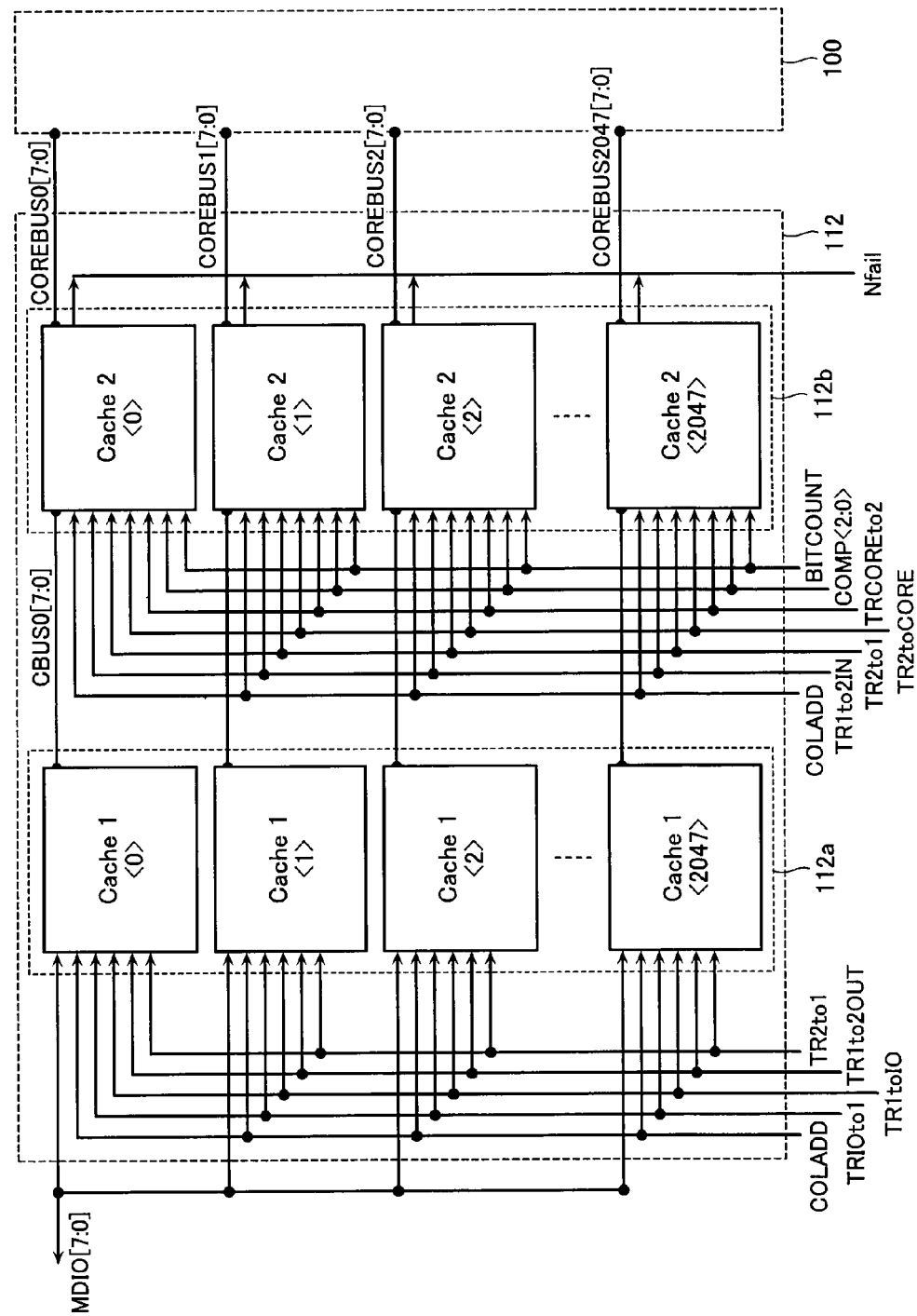
FIG. 9 shows the internal configuration of the page register.

FIG. 9 shows a configuration of the page register 112, in which the minimum requirements are met for achieving this embodiment. It is supposed here that one page is constituted by 2 kByte, and the register includes a first cache circuit 112a formed of one page caches "Cache1", and a second cache circuit 112b formed of one page caches "Cache2". If necessary, there may be prepared caches more than two pages.

The first cache circuit 112a holds one page program data in a data program mode. The second cache circuit 112b has a function of: reading and holding the preprogrammed data corresponding to the program data loaded in the first cache circuit 112a, and comparing and checking the program data with the read data (i.e., preprogrammed data) for judging whether there are one or more disagreement bits between the corresponding data bits.

The first cache circuit (Cache1) 112a is controlled with the following signals: column address signal COLADD for designating 1 Byte address in 2 kByte; signal "TRIOto1" for permitting the program data transferring in the direction from the output buffer to Cache1; signal "TR1to2OUT" for permitting data transferring in the direction from Cach1 to Cache2; signal "TR2to1" for permitting data transferring in the direction from Cach2 to Cache1; and signal "TR1toIO" for permitting data transferring in the direction from Cach1 to the output buffer.

There are disposed buses CBUS0[7:0] to CBUS2047[7:0] each transferring 1 Byte data between Cache1 and Cache2. If necessary, there may be prepared another type of data buses, each of which is shared by multiple Byte address.

The second cache circuit (Cache2) 112b is controlled with the following signals: column address signal COLADD; signal "TR1to2IN" for permitting the data transferring in the direction from Cache1 to Cache2; signal "TR2to1" for permitting data transferring in the direction from Cach2 to Cache1; signal "TR2toCORE" for permitting data transferring in the direction from Cach2 to the sense amplifier; signal "TRCOREto2" for permitting data transferring in the direction from the sense amplifier to Cache2; signal COMP<2:0> for permitting the data comparing; and signal "BITCOUNT" for permitting data transferring the compared result to fail bit counter circuit 111.

In addition to the above-described data buses CBUS0[7:0] to CBUS2047[7:0] disposed between Cache1 and Cache2, there are prepared buses COREBUS0[7:0] to COREBUS2047[7:0] used for transferring data between Cache2 and the sense amplifier, and between Cache2 and bus Nfail used for transferring the compared result.

In this embodiment, each of the connection buses between Cache2 and the sense amplifier is formed here for transferring 1 Byte data, but if necessary it may be permissible to use another type of buses, each of which is shared by multiple Bytes. Further, although it is shown here that bus Nfail is shared by the entire Bytes, if necessary it may be divided into multiple parts in consideration of the transferring time.

Figures 10, 12:
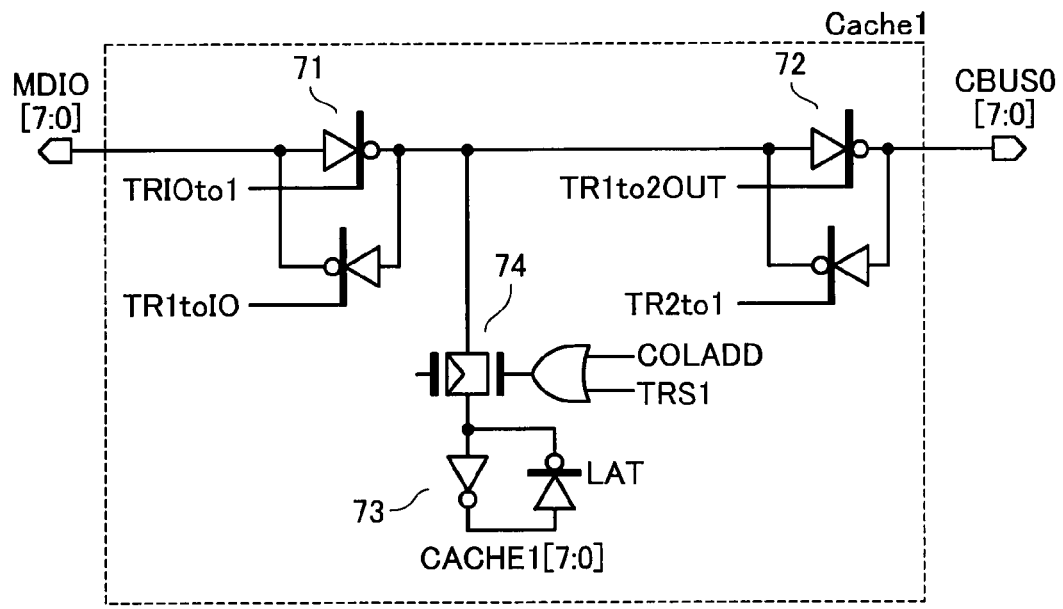
FIG. 10 shows the internal configuration of the first cache circuit in the page register.
FIG. 12 shows the input and output of the logic circuit constructed in the second cache circuit.

FIG. 10 shows a typical internal configuration of the cache, Cache1, in the first group.

Data holding node CACHE1[7:0] is a node of data latch 73. Although there is not shown in FIGS. 1 and 9, data latch 73 is controlled with signal LAT for directing to hold data. Coupled to the data node is transfer gate 74, to which OR logic signal of column address COLADD and transferring signal TRS1 is input for coupling data bus MDIO[7:0] to the data node.

Column address signal COLADD is activated when data is input from IO pins via input/output buffer Byte by Byte (in detail, when program data is loaded), while signal TRS1 is activated, for example, when data is transferred in a lump from Cache1 to Cache2.

Disposed on the input/output buffer side is bus arbiter 71, in which the transferring direction will be determined by two signals TRIOto1 and TR1toIO. Disposed on the Cache2 side is another arbiter 72, in which the transferring direction will be determined by two signals TR1to2OUT and TR2to1.

These bus arbiters 71 and 72 are controlled so as to avoid data collision.

Figure 11:
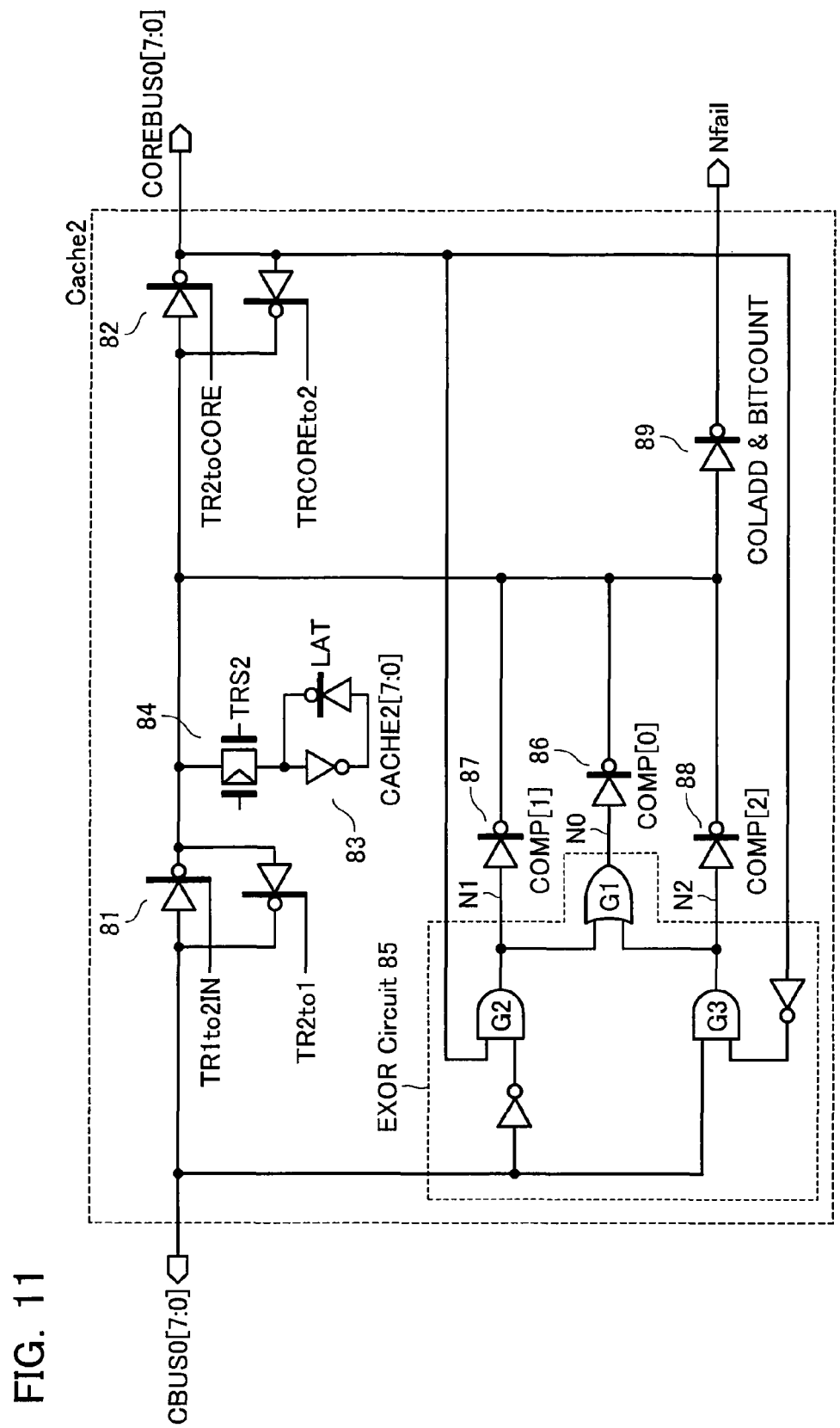
FIG. 11 shows the internal configuration of the second cache circuit in the page register.

FIG. 11 shows a typical internal configuration of the cache, Cache2, in the second group.

Node of data latch 83 serves as data holding node CACHE2[7:0]. To couple the data node to buses, transfer gate 84 and bus arbiters 81 and 82 are disposed. These circuit elements and control signals applied to them are about the same as those in Cache1.

Additionally disposed in Cache2 is a logic operational circuit portion, which logically processes the output data of Cache1 and read data (i.e., verify-read result) of the sense amplifier and outputs the compared result. EXOR circuit 85 is a logic operation circuit for judging data.

The output node N0 of OR gate G1, to which the judged result of EXOR is generated, is coupled to inverter 86, which is activated by COMP[0], and the output will be finally transferred to and latched at data holding node CACHE2[7:0]. AND gate G2 takes AND logic between inverted data of Cache1 and the read result (verify-read result) of the sense amplifier. The output node N1 of AND gate G2 is coupled to inverter 87, which is activated by COMP[1]. AND gate G3 takes AND logic between data of Cache1 and the read result (verify-read result) of the sense amplifier. The output node N2 of AND gate G3 is coupled to inverter 88, which is activated by COMP[2].

As similar to the judged result of EXOR gate, AND operation results of these AND gates may also be transferred to and latched at data holding node CACHE2[7:0].

Disposed for outputting the compared result is inverter 89, which is controlled by column address COLADD and signal BITCOUNT. As a result, it becomes possible to output to output bus Nfail not only data held at data holding node CACHE2[7:0] but also the output of the logic operation circuit portion.

EXOR circuit 85 shown in FIG. 11 performs the logic operations shown in FIG. 12. If node CACHE1 is "0" (i.e., "0" program) and cell read result (i.e., verify-read result) is "1", it results in that N0=N1=1, and N2=0. This designates that "0" program bit disagrees with the corresponding preprogrammed bit.

If node CACHE1 is "1" (i.e., "0" program) and cell read result (i.e., verify-read result) is "0", it results in that N0=N2=1, and N1=0. This designates that "1" program bit disagrees with the corresponding preprogrammed bit.

If node CACHE1 is "1" (i.e., "1" program) and cell read result (i.e., verify-read result) is "1", it results in that N0=N1=N2=0. This designates that "1" program is completed or programming is unnecessary.

If node CACHE1 is "0" (i.e., "0" program) and cell read result (i.e., verify-read result) is "0", it results in that N0=N1=N2=0. This designates that "0" program is completed or programming is unnecessary.

That is, Data at N0 is the EXOR operation result. When "0" data program bit or "1" data program bit is disagreed with the corresponding preprogrammed bit, disagreement signal=1 is obtained at node N0.

When "0" program bit disagrees with the corresponding preprogrammed bit, disagreement signal=1 is obtained at node N1. When "1" program bit disagrees with the corresponding preprogrammed bit, disagreement signal=1 is obtained at node N2.

The above-described disagreement bit is output for every bit of the program data, and it will be transferred to fail bit counting circuit via bus Nfail. Here is shown such an example that data is serially transferred Byte by Byte under the control of the column address. However, it becomes possible to transfer two or more Byte data in parallel. Further, there may be disposed plural fail bit counter circuits.

Figure 13:
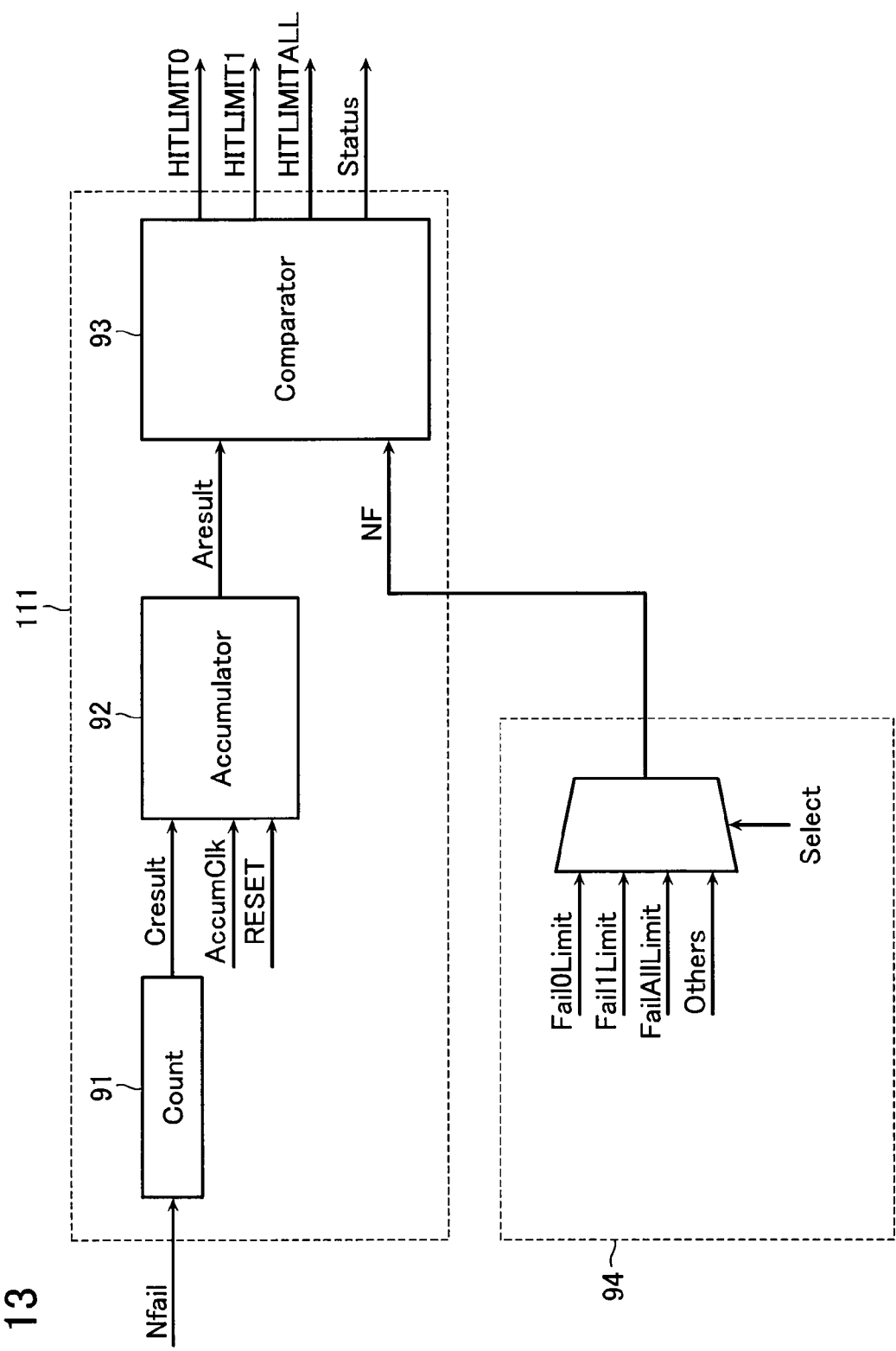
FIG. 13 shows the fail bit count circuit and the select circuit coupled to it.

FIG. 13 shows the internal configuration of the fail bit counter circuit 111, which has conventional counter 91 for counting disagreement bits, accumulator 92 for holding the counted result "Cresult" transferred from the counter, and comparator 93.

Input to the accumulator 92 in addition to "Cresult" are signal "AccumCLK" for directing the accumulation of the counted result and reset signal "Reset" for initializing the counted result. Comparator 93 is for comparing the accumulated value "Aresult" obtained in the accumulator 92 with a reference value (i.e., permissible value) via bus NF.

Comparator 93 outputs one of the following three signals in accordance with the operation result COM[2:0]: "HITLIMITALL" designating the compared result obtained by comparing the disagreement bit number of EXOR with a permissible value "FailAllLimit"; "HITLIMIT0" designating the compared result obtained by comparing the disagreement bit number with respect to "0" program data with another permissible value "Fail0Limit"; and "HITLIMIT1" designating the compared result obtained by comparing the disagreement bit number with respect to "1" program data with still another permissible value "Fail1limit". In the status read command sequence described later, comparator 93 outputs status information "Status".

A specific configuration of the fail bit count circuit 111 in accordance with this embodiment is in the selector circuit 94 formed in the sequence control circuit 107 to generates the predetermined permissible values. That is, the selector circuit 94 selects one in three permissible values to output to bus NF as follows: permissible value "FailAllLimit" serving as the reference value for the total disagreement bit number obtained by EXOR; permissible value "Fail0Limit" serving as the reference value for the disagreement bit number in "0" program data; and permissible value "Fail1Limit" serving as the reference value for the disagreement bit number in "1" program data. As a result of the comparing with one of the permissible values "FailAllLimit", "Fail0Limit" and "Fail1Limit" in the comparator 93 described above, one of the compared results "HITLIMITALL", "HITLIMIT0" and "HITLIMIT1" is output.

Figure 14:
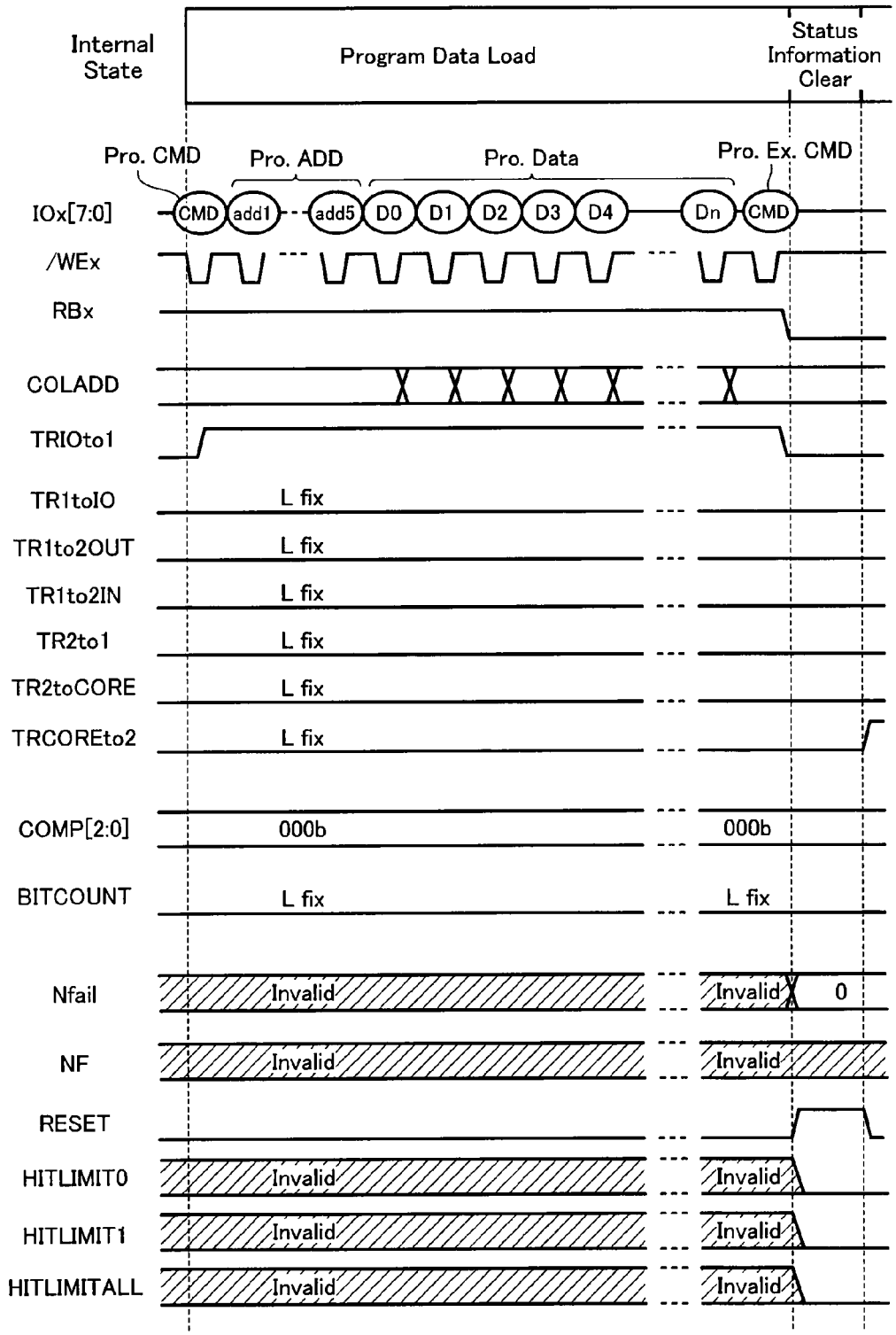
FIG. 14 shows the internal operation timing chart and the signal logic states (part 1).
Figure 15:
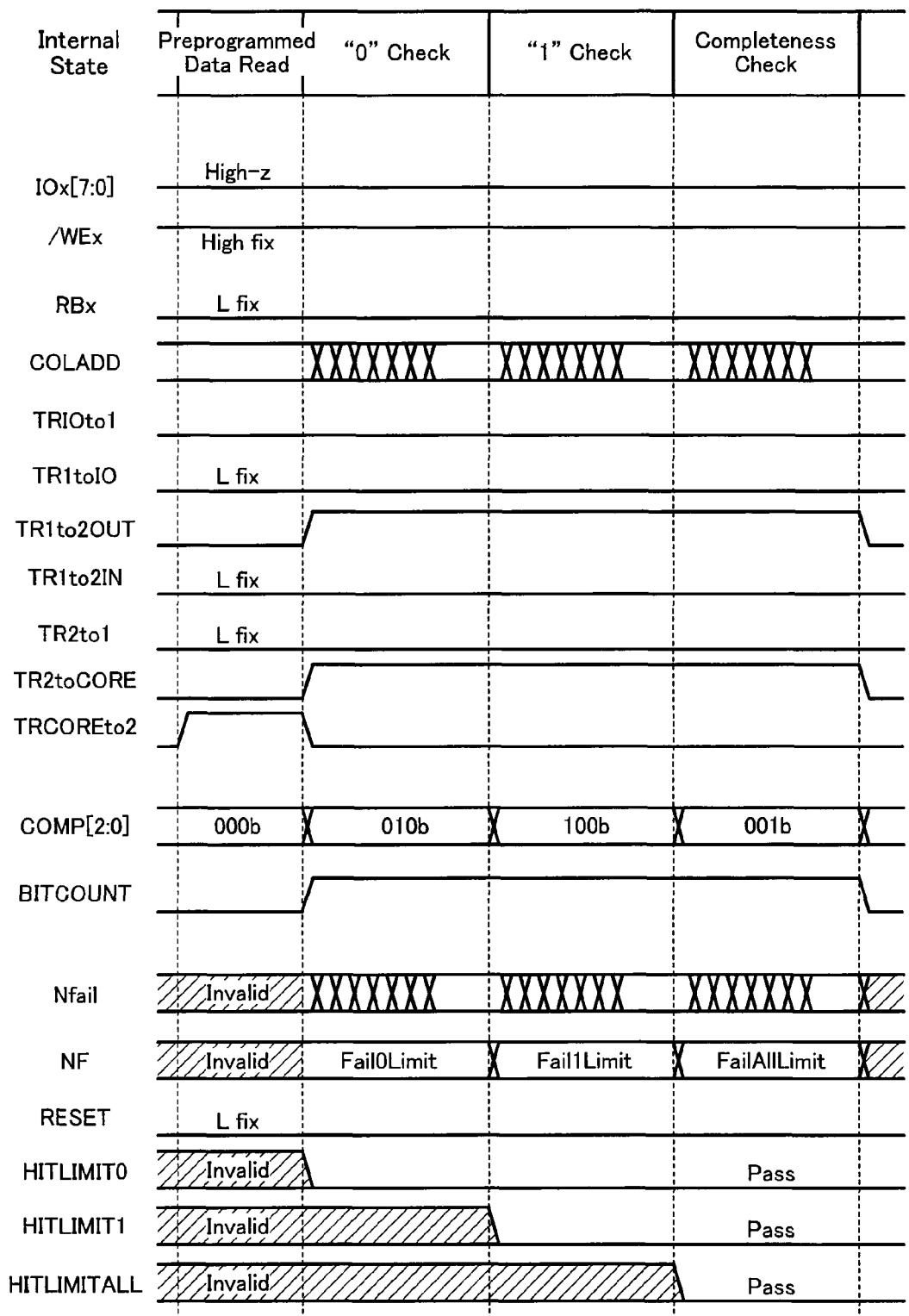
FIG. 15 shows the internal operation timing chart and the signal logic states (part 2).
Figure 16:
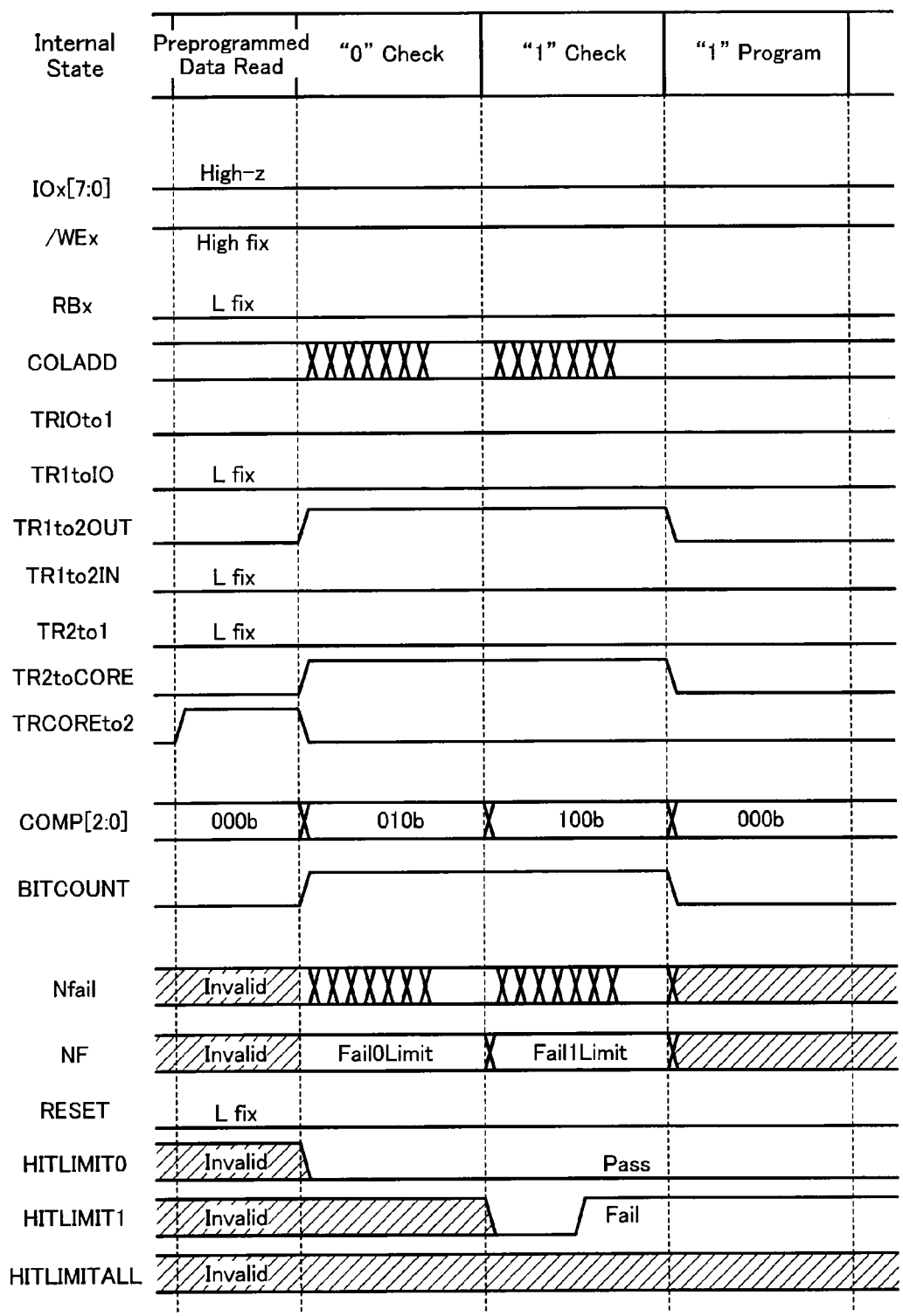
FIG. 16 shows the internal operation timing chart and the signal logic states (part 3).

FIGS. 14 to 16 show the timing charts of program control signals in accordance with this embodiment, which are constituted in corresponding to the flow chart shown in FIG. 8.

In the program data load corresponding to step S1, program address is input together with program command. Following the address input, program data is input Byte by Byte. At this time, signal TRIOto1 is activated for permitting data transfer from the input buffer to Cache1, and the program data are sequentially loaded in Cache1 under the control of column address COLADD.

After the program data loading, program execute command is input, and ready/busy pin PBx is changed to notice externally that the data program has been started.

In the status information clearing time corresponding to step S2, internal signal RESET is activated. This internal reset signal RESET is typically input to the hold circuit 92 shown in FIG. 13, and used for initializing other status information registers (not shown).

In the successive preprogram data read operation (step S3), as shown in FIG. 15, signal TRCOREto2 is activated for permitting data transfer from Cache2 to the sense amplifier.

Note here in this read operation that it is not necessary to read page data at a time, and it is possible to divide one page data into multiple data units of several Bytes. In this case, read data will be sequentially stored in Cache2.

In the successive "0" check operation (corresponding to step S4), to perform the logic operation without transferring the program data stored in Cache1 to Cache2, signal TR1to2OUT is activated to be output on buses CBUS0[7:0] ~CBUS2047[7:0]. On the other hands, signal TR2toCORE is activated for outputting the read data stored in Cache2 to buses COREBUS0[7:0]—COREBUS2047[7:0].

In the "0" check operation, only "0" program data bits are subjected to comparing and checking, and the compared results (disagreement bits) will be sequentially output on bus Nfail in accordance with column address COLADD. At this time, sequence control circuit outputs the permissible value "Fail0Limit" for "0" program data on bus NF.

Receiving it, the disagreement bit count values are sequentially compared with the permissible value transferred on bus NF. In the example shown in FIG. 15, the "0" check operation ends with signal "HITLIMIT0" is kept inactive for designating that the disagreement bit number is smaller than the permissible value.

In the successive "1" check operation (corresponding to step S5), only "1" program data bits are subjected to comparing and checking, and the compared results will be sequentially output to bus Nfail. Output to bus NF at this time is the permissible value "Fail1Limit" for "1" program data. In this example, the disagreement bit number is smaller than the permissible value, so that signal "HITLIMIT1" is kept inactive.

There is no problem to finish the program operation after the above-described two checking operations. In this embodiment, to judge the data completeness, the completeness checking operation (corresponding to step S7) is performed in addition to the "0" check and "1" check operations. In this case, to count the disagreement bits of "0" program data and "1" program data, the total disagreement bits obtained EXOR will be counted.

In the example shown in FIG. 15, it is shown that the program data is identical with the preprogrammed data in its entirety, in addition to that "0" program data and "1" program data are identical with the corresponding preprogrammed data.

In FIG. 16, it is shown that one of the disagreement bit numbers in "0" check and "1" check is over the corresponding permissible value, and an additional program operation is performed. In detail, in the "1" check operation, the disagreement bit number of "1" program data are over the permissible value halfway, and signal "HITLIMIT1" is activated.

That is, it is shown that there in not detected a disagreement bit in "0" program data, but there are detected disagreement bits in "1" program data, and it becomes necessary to perform "1" program operation. Therefore, as shown in FIG. 16, the "1" program (program "1") operation will be additionally performed. Additional "0" program is not necessary, and the successive additional program operations are omitted. This is judged in the sequence control circuit.

In the example described above, it has been explained that the program data in Cache1 is compared with the read data in Cache2. In case one page data is divided into multiple units to be programmed unit by unit, and the check operations are repeatedly performed for every unit, it is possible to perform in such a manner as to compare and check the every divided unit, and sequentially accumulate the checked results. In this case, data on buses COREBUS0[7:0]~CORE2047[7:0] may be directly input to the comparator without activating the signal "TR2toCORE", which permits for transferring data from Cache2 to the sense amplifier.

Further, the compared results may be stored in Cache2 for the sake of, for example, supplying them for the following program operation.

FIG. 17 shows a counted result of the disagreement bits on the assumption that one page is simply formed of eight bits. As a result of comparing the program data in Cache1 with the verify-read data, the number of disagreement bits in "0" program data (N1) is 4-bit; the number of disagreement bits in "1" program data (N2) is 1-bit; and the total number of the disagreement bits in one page (N0) is 5-bit.

In the memory device with resistance change memory cells arranged as explained in this embodiment, "1" program and "0" program are performed under the control of a program command. Supposing, for example, that it is permitted up to four bits of the disagreement bits, five bits detected as the disagreement bits in this example shown in FIG. 17, so that it is judged to be necessary for performing the additional program operation.

If there are disagreement bits in both "0" and "1" program data in this case, it will be primarily performed both of "0" program and "1" program. However, in case, for example, "1" program time is shorter than "0" program time, and "1" program efficiency is higher than that of "0" program, it is desirable to perform only additional "1" program operation. As a result, it becomes possible to reduce the disagreement bit number in the page, and improve the program performance of the entire memory system.

Note here that in case both of the disagreement bit numbers of "1" program data and "0" program data are large, it often becomes necessary to perform both of "1" program and "0" program for satisfying the total permissible value. Further, if disagreement bit numbers of "1" program data and "0" program data are smaller than the respective permissible values, it becomes possible to select such a case that neither "1" program nor "0" program is performed.

Further, in this embodiment, it is constituted that disagreement bit numbers of "1" program data and "0" program data, and the sum of them may be output externally after programming. In detail, as shown in FIG. 1, status signal STATUS is output from fail bit counter circuit 111 to output buffer 106a, and may be generated to IO pins. Alternatively, it becomes possible to output only the information of whether the disagreement bit number is over the permissible value or not without noticing the counted result.

Receiving the information, a control device for controlling the ReRAM (for example, memory controller 202 shown in FIG. 19) is able to select an error correction algorism suitable for the data state. This will bring a wide-usefulness improvement of the system with the non-volatile memory device.

FIG. 18 shows an example of the information form in accordance with the status information output command in this embodiment. Supposing that 8-bit information may be obtained, it is constituted that "→0 program fail", "0→1 program fail" and "program fail" obtained by adding the above-described two fails may be generated from the respective bits.

In the embodiment, the disagreement bit numbers are compared with the respective permissible values predetermined for "0" and "1" program data. To represent the following three states—(1) there is not a disagreement bit; (2) there are disagreement bits less than a permissible value; and (3) there are disagreement bits greater than the permissible value, with respect to "1" data, "0" data and the sum of them, at least each 2-bit, then total 6-bit information will be output.

Figure 19:
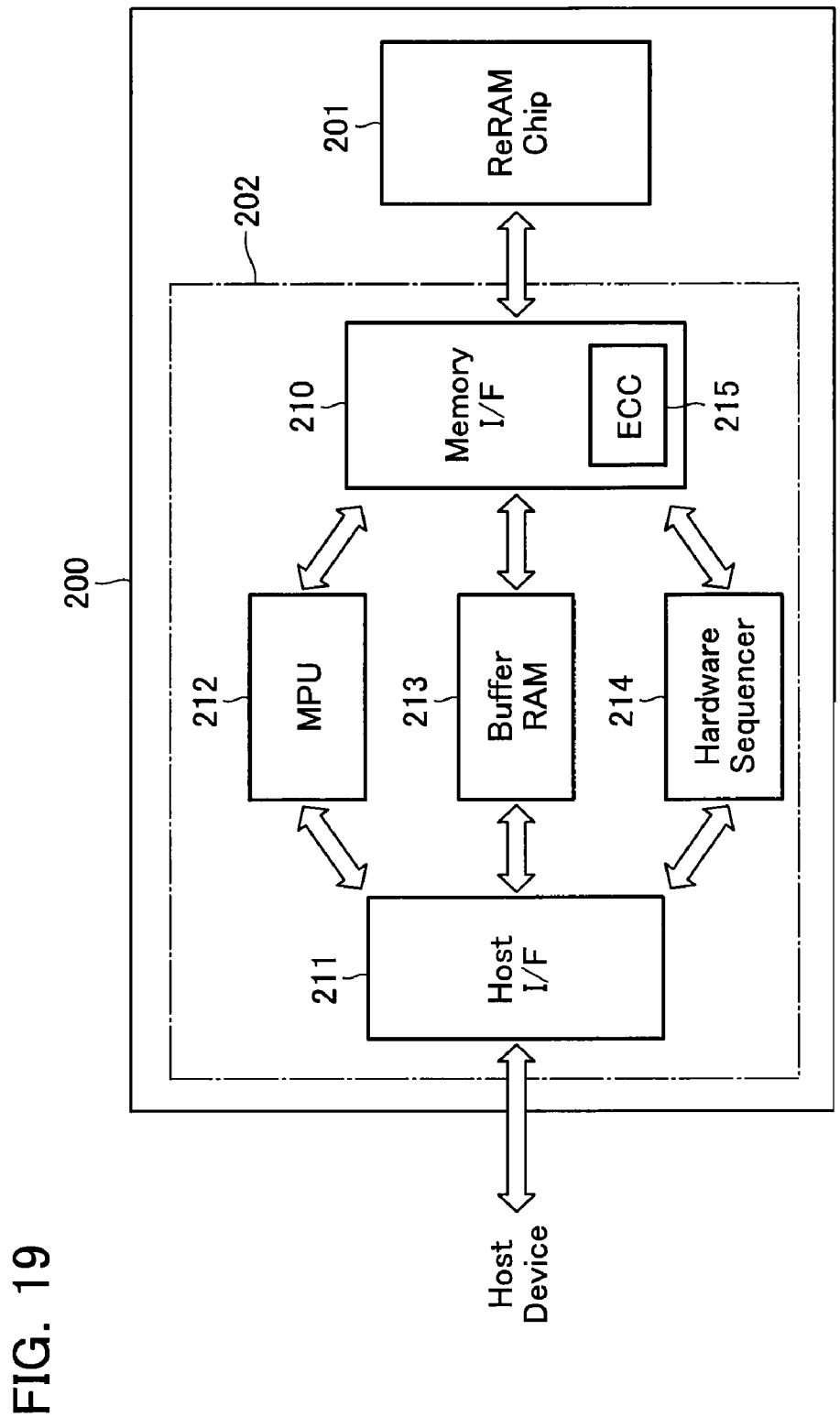
FIG. 19 shows the memory card configuration with an ReRAM chip and a memory controller installed.

As a result, in a memory device shown in FIG. 19, controller 202 for controlling the ReRAM chip 201 may be provided with information for selecting a suitable error correction algorism in accordance with the programmed result.

In case it is desired to output not only 2-bit information but also the respective fail numbers, there will be installed a format, bit width, method and the like, with which the information quantity with desirable bits is secured.

In the non-volatile memory device with three-dimensionally stacked resistance change elements, the above-described cache circuits will be formed on the silicon substrate underlying the stacked cell arrays. In general in this case, there is a limitation of the circuit layout, so that it is difficult to do a complicated control. However, according to this embodiment, it becomes possible to improve the wide-usefulness of the memory device with minimum additional circuits.

It should be noted that part of the ReRAM program control functions described in the embodiment may be installed in the external memory controller.

For example, FIG. 19 shows a memory card, in which ReRAM chip 201 and memory controller 202 are installed. Controller 202 includes memory interface 210, host interface 211, MPU 212, Buffer RAM 213, hardware sequencer 214 and the like. Memory interface 210 has ECC circuit 215 for detecting and correcting errors of the read data.

In the above-described embodiment, the fail bit count circuit explained in FIG. 13 and the logic circuit function for judging data disagreement in the page register 112 may be installed in not the internal controller in ReRAM chip 201 but the external memory controller 202. By contrast, ECC circuit 215 in the memory controller 202 may be installed in ReRAM chip 201.

This invention is not limited to the above-described embodiment. It will be understood by those skilled in the art that various changes in form and detail may be made without departing from the spirit, scope, and teaching of the invention.

What is claimed is:

1. A non-volatile memory device comprising:
a memory cell array with memory cells arranged therein, each memory cell storing an electrically rewritable resistance value as data in a non-volatile manner;
a first cache circuit configured to hold program data to be programmed in the memory cell array;
a second cache circuit configured to hold preprogrammed data read from an area of the memory cell array, where the program data is to be programmed; and
a judging circuit configured to compare and check data state bits of a first logic state in the program data loaded in the first cache circuit with corresponding bits in the preprogrammed data read in the second cache circuit, compare and check data state bits of a second logic state in the program data loaded in the first cache circuit with corresponding bits in the preprogrammed data read in the second cache circuit, and judge whether there are one or more disagreement bits therebetween or not with respect to the first logic state bits and the second logic state bits in the program data respectively;
a fail bit counting circuit configured to count the disagreement bits detected in the judging circuit, and compare the disagreement bit number with a permissible value to output the compared result with respect to the first logic state bits and the second logic state bits in the program data respectively.

2. The non-volatile memory device according to claim 1, wherein
the fail bit counting circuit comprises:
a counter configured to count the disagreement bits with respect to the first logic state bits and the second logic state bits in the program data of one page to be simultaneously programmed;
a comparator configured to judge whether the disagreement bit number is over a reference value or not, and output a compared result serving for program-controlling; and
a selector circuit configured to select one of permissible values predetermined for the first logic state bits, the second logic state bits and the entire logic states, respectively, and apply it to the comparator as the reference value.

3. The non-volatile memory device according to claim 2, further comprising:
an output buffer configured to output status information with respect to the disagreement bit number after programming.

4. The non-volatile memory device according to claim 3, further comprising:
an ECC circuit for detecting and correcting errors contained in read data read from the memory cell array, the error-correcting algorithm of which is selected to be suitable in accordance with the status information.

5. The non-volatile memory device according to claim 1, wherein
the memory cell array has plural cell array layers stacked, each cell array layer having bit lines and word lines crossing each other and the memory cells disposed at the cross points thereof, each memory cell being formed of a resistance change element and a non-ohmic device connected in series.

6. The non-volatile memory device according to claim 5, wherein the memory cell is of a unipolar type.

7. The non-volatile memory device according to claim 1, wherein
in case that the disagreement bit number is less than the permissible value, the judging circuit judges whether the program data and the preprogrammed data are completely identical with each other or not, ends a sequence in a case that the both data are completely identical, and sets status information and ends the sequence in a case that the both data are not completely identical.

8. A non-volatile memory device comprising:
a memory cell array with memory cells arranged therein, each memory cell storing an electrically rewritable resistance value as data in a non-volatile manner;
a page register configured to hold program data to be programmed in the memory cell array and preprogrammed data read from an area of the memory cell array, where the program data is to be programmed;
a judging circuit configured to compare and check data state bits of a first logic state in the program data with corresponding bits in the preprogrammed data and data state bits of a second logic state in the program data with corresponding bits in the preprogrammed data, and judge whether there are one or more disagreement bits therebetween or not with respect to the first logic state bits and the second logic state bits in the program data respectively;
a fail bit counting circuit configured to count the disagreement bits, and compare the disagreement bit number with a permissible value to output a compared result with respect to the first logic state bits and the second logic state bits in the program data respectively; and
a sequence controller configured to control a program sequence in accordance with the compared result.

9. The non-volatile memory device according to claim 8, wherein
the page register comprises first and second cache circuits for holding the program data and preprogrammed data, respectively, and a logic gate circuit constituting the judging circuit.

10. The non-volatile memory device according to claim 9, wherein
the first cache circuit has caches for holding the program data of one page to be simultaneously programmed; and
the second cache circuit has caches for holding the preprogrammed data of one page corresponding to the program data.

11. The non-volatile memory device according to claim 8, wherein the fail bit counting circuit comprises:
a counter configured to count the disagreement bits with respect to the first logic state bits and the second logic state bits in the program data of one page to be simultaneously programmed;
a comparator configured to judge whether the disagreement bit number is over a reference value or not, and output a compared result serving for program-controlling; and
a selector circuit configured to select one of permissible values predetermined for the first logic state bits, the second logic state bits and the entire logic states, respectively, and apply it to the comparator as the reference value.

12. The non-volatile memory device according to claim 8, further comprising:
an output buffer configured to output status information with respect to the disagreement bit number after programming.

13. The non-volatile memory device according to claim 12, further comprising:
an ECC circuit for detecting and correcting errors contained in read data read from the memory cell array, the error-correcting algorithm of which is selected to be suitable in accordance with the status information.

14. The non-volatile memory device according to claim 8, wherein
the memory cell array has plural cell array layers stacked, each cell array layer having bit lines and word lines crossing each other and the memory cells disposed at the cross points thereof, each memory cell being formed of a resistance change element and a non-ohmic device connected in series.

15. The non-volatile memory device according to claim 14, wherein
the memory cell is of a unipolar type.

16. The non-volatile memory device according to claim 8, wherein
in case that the disagreement bit number is less than the permissible value, the judging circuit judges whether the program data and the preprogrammed data are completely identical with each other or not, ends a sequence in a case that the both data are completely identical, and sets status information and ends the sequence in a case that the both data are not completely identical.

17. A method of programming a non-volatile memory device with a memory cell array, in which a resistance-change type of memory cells are arranged, comprising:
loading program data of one page to be simultaneously programmed in the memory cell array;
reading preprogrammed data corresponding to the program data from the memory cell array;
counting first disagreement bits between the corresponding bits in the program data and the preprogrammed data with respect to data state bits of a first logic state in the program data;
counting second disagreement bits between the corresponding bits in the program data and the preprogrammed data with respect to data state bits of a second logic state in the program data;
judging whether the number of the first disagreement bits is over a first permissible value or not;
judging whether the number of the second disagreement bits is over a second permissible value or not; and
controlling data program into the memory cell array in accordance with the judged result.

18. The method according to claim 17, wherein the procedure of controlling data program into the memory cell array is, in consideration of the disagreement bit numbers of the first logic state and the second logic state bits, selected as follows: to program either of the first logic state bits and the second logic state; or to program both of the first and second logic states; or not to program both of the first and second logic states.

* * * * *